United States Patent
Krishna

(10) Patent No.: US 11,463,086 B2
(45) Date of Patent: Oct. 4, 2022

(54) CONTROL CIRCUIT FOR AN H-BRIDGE CIRCUIT

(71) Applicant: TEXAS INSTRUMENTS INCORPORATED, Dallas, TX (US)

(72) Inventor: Kannan Krishna, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/029,277

(22) Filed: Jul. 6, 2018

(65) Prior Publication Data

US 2019/0229727 A1 Jul. 25, 2019

Related U.S. Application Data

(60) Provisional application No. 62/621,850, filed on Jan. 25, 2018.

(51) Int. Cl.
| | |
|---|---|
| *H03K 17/687* | (2006.01) |
| *H02M 7/5387* | (2007.01) |
| *H02M 3/337* | (2006.01) |
| *H02M 3/158* | (2006.01) |

(52) U.S. Cl.
CPC ...... *H03K 17/6872* (2013.01); *H02M 7/5387* (2013.01); *H03K 17/6874* (2013.01); *H02M 3/158* (2013.01); *H02M 3/3374* (2013.01)

(58) Field of Classification Search
CPC .......... H03K 17/6872; H03K 17/6874; H02M 3/158; H02M 3/3374; H02M 7/5387
See application file for complete search history.

(56) References Cited

U.S. PATENT DOCUMENTS

| | | | |
|---|---|---|---|
| 6,720,805 B1 * | 4/2004 | Haas | H03F 3/45183 326/83 |
| 9,100,010 B2 * | 8/2015 | Rowley | H03K 17/102 |
| 9,712,159 B2 * | 7/2017 | Isoda | H03K 19/0185 |

* cited by examiner

*Primary Examiner* — Menatoallah Youssef
*Assistant Examiner* — Colleen J O Toole
(74) *Attorney, Agent, or Firm* — Ray A. King; Charles A. Brill; Frank D. Cimino

(57) ABSTRACT

A circuit comprises an H-bridge circuit that includes a pair of current sources and a plurality of transistors. The H-bridge circuit includes a first output and a second output. One of the current sources is coupled to receive a supply voltage. A control circuit is configured to control, based on a sum of voltages on the first and second outputs, current of at least one of the current sources through at least some of the plurality of transistors.

19 Claims, 2 Drawing Sheets

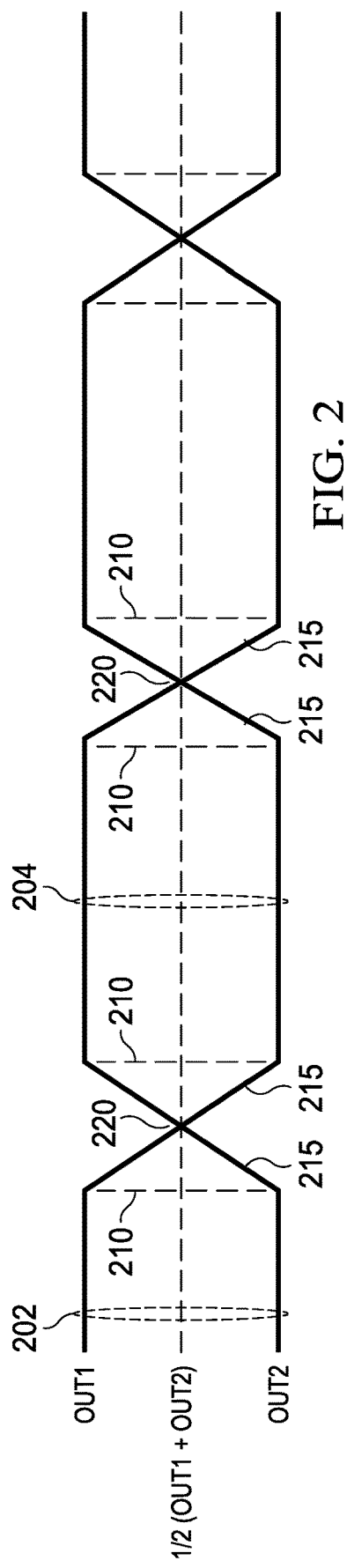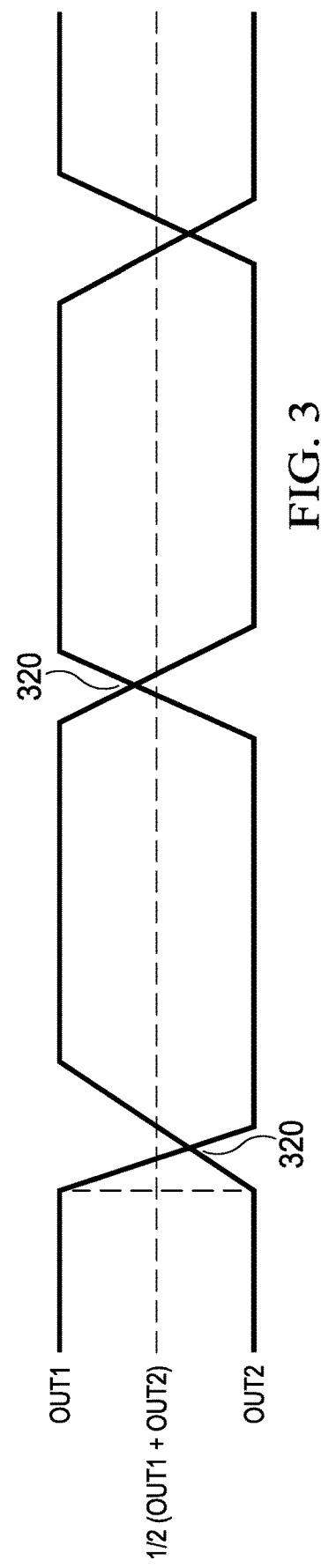

CONTROL CIRCUIT FOR AN H-BRIDGE CIRCUIT

RELATED APPLICATIONS

This application claims priority to U.S. Provisional Application No. 62/621,850, filed Jan. 25, 2018, which is hereby incorporated by reference.

BACKGROUND

An H-bridge circuit is a circuit that causes current to be provided to a load bi-directionally. That is, in one phase of operation, current flows to the load in one direction, and in another phase of operation, the direction of the current reverses. The voltage that is applied to the load also flips polarity. H-bridge circuits are used for a variety of applications such as motor controllers, power inverters, and the like.

SUMMARY

In one example, a circuit comprises an H-bridge circuit that includes a pair of current sources and a plurality of transistors. The H-bridge circuit includes a first output and a second output. One of the current sources is coupled to receive a supply voltage. A control circuit is configured to control, based on a sum of voltages on the first and second outputs, current of at least one of the current sources through at least some of the plurality of transistors.

BRIEF DESCRIPTION OF THE DRAWINGS

For a detailed description of various examples, reference will now be made to the accompanying drawings in which:

FIG. 2 shows a timing diagram illustrating the operation of an H-bridge circuit which has a constant output common mode voltage.

FIG. 3 shows a timing diagram illustrating the operation of an H-bridge circuit which does not have a constant output common mode voltage.

DETAILED DESCRIPTION

Figure 1:
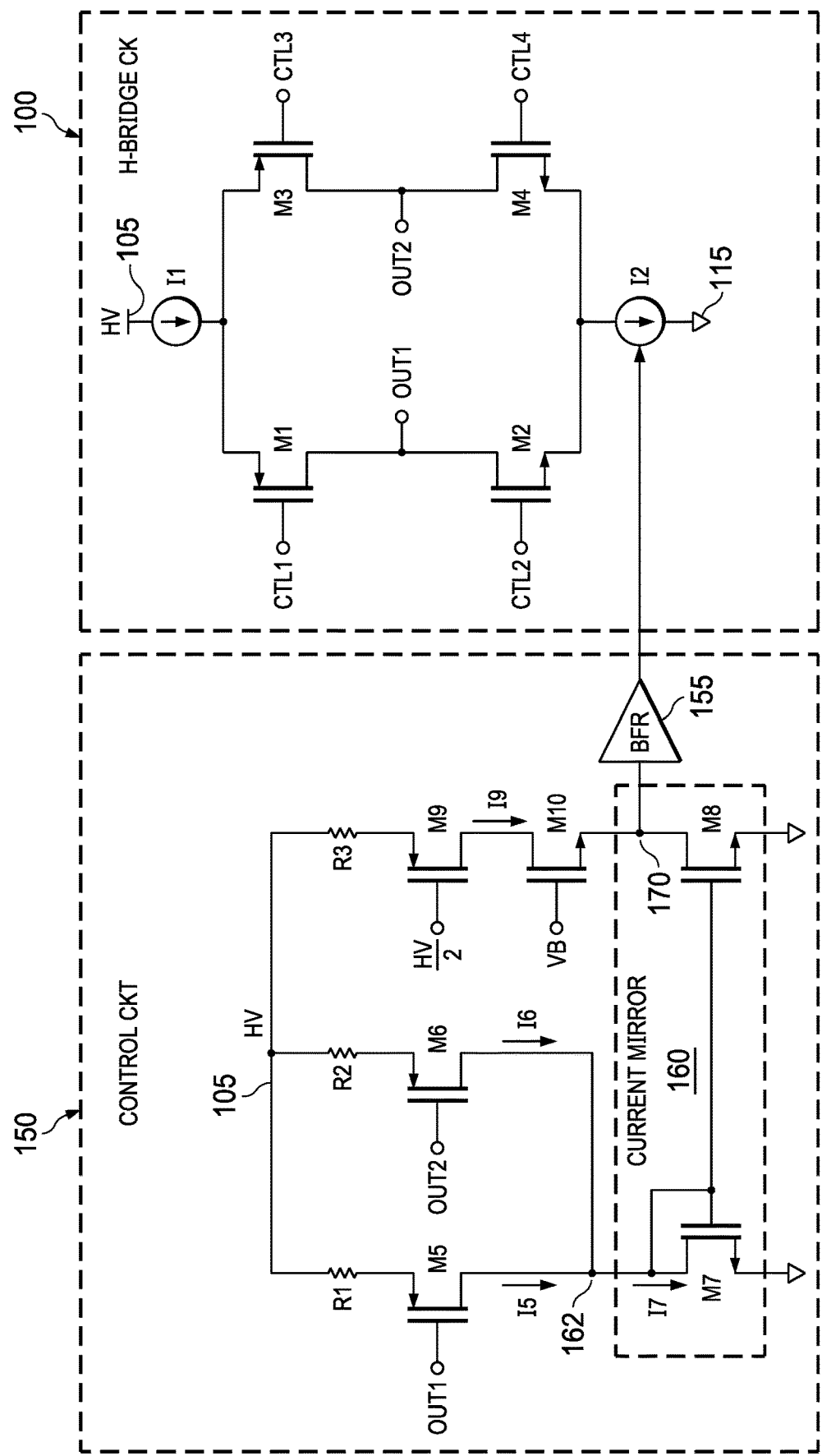
FIG. 1 illustrates a control circuit for an H-bridge circuit in accordance with an example.

An H-bridge circuit provides a differential voltage to a load. A differential voltage has a "common mode" voltage. When referenced to the local common or ground, a common-mode signal appears on both output terminals of the H-bridge circuit, in-phase and with equal amplitudes. A common-mode voltage can be defined as one-half the sum of the voltages between each output terminal of a balanced circuit and the local ground. Some loads driven by an H-bridge circuit tolerate variation in the common-mode voltage, while other loads do not. For example, an output common mode voltage that varies significantly can cause electro-magnetic interference which may be unacceptable in some systems.

The disclosed examples are directed to a control circuit for an H-bridge circuit. In some examples, the H-bridge circuit is driven by a relatively high voltage source. In one example, the voltage source is 50V, although any size voltage source can be used (e.g., at least 25V in some embodiments). Although reference is made herein to a high voltage (HV) source, unless otherwise specified, no limitation is made on the size of the voltage source. The disclosed control circuit controls the slew rate at which transistors within the H-bridge circuit turn on and off so as to ensure relatively equal slew rates among the transistors and thus a relatively constant common mode voltage. Further, the control circuit generally operates in a relatively low voltage domain.

FIG. 1 shows an example of an H-bridge circuit 100 controlled by a control circuit 150. The H-bridge circuit 100 includes transistors M1, M2, M3, and M4, and current sources I1 and I2. The terms "I1" and "I2" can refer to either the respective current sources or the magnitude of the current through the current sources, and the use of I1 and I2 will be clear from the context. As shown in this example, M1 and M3 are p-type metal oxide semiconductor field effect transistors (p-type MOSFET or PMOS) and M2 and M4 are n-type MOSFET (NMOS) devices. In other implementations, M1 and M3 are NMOS devices and M2 and M4 are also NMOS devices. In still other implementations, M1-M4 can be implemented as bipolar junction transistors. Each transistor M1-M4 shown in FIG. 1, as well as the transistors of the control circuit 150 (discussed below) has a control input and a pair of current terminals. In the case in which a transistor is a MOSFET, the control input is the gate and the current terminals are the drain and source of the transistor. In the case in which a transistor is implemented as a bipolar junction device, the control input is the base and the current terminals are the emitter and collector.

The gate of each of M1-M4 is controlled by a respective control signal. CTL1 controls the gate of M1. CTL2 controls the gate of M2. CTL3 controls the gate of M3. CTL4 controls the gate of M4. In operation, a controller (not shown) generates the control signals CTL1-CTL4. The sources of M1 and M3 are connected together and to current source I1. The drains of M1 and M2 are connected together, and the drains of M3 and M4 are connected together. The sources of M2 and M4 are connected together and to current source I2. Current source I1 is connected to a supply voltage node 105 and current source I2 is connected to a ground node 115. The supply voltage provided on the supply voltage node 105 is shown as "high voltage" (HV), but as noted above, no limitation is made on the magnitude of HV. In one example, however, HV is 50 V.

The output terminals of the H-bridge circuit 100 are designated as OUT1 and OUT2. OUT1 provides the voltage on the node interconnecting the drains of M1 and M2. OUT2 provides the voltage on the node interconnecting the drains of M2 and M4. OUT1 and OUT2 can be connected to a load (not shown). The control signals CTL1-CTL4 are controlled to cause M1 and M4 to be on (with M2 and M3 off) at one point in time, and at another point in time the control signals are controlled to cause M3 and M2 are on (with M1 and M4 off). When M1 is on and M2 is off, OUT1 will be at a voltage approximately equal to HV (HV less any voltage drop across I1 and the drain-to-source voltage across M1, which is minimal compared to HV). With M4 on as well, OUT2 will be at approximately ground. In this state, OUT1 is at HV and OUT2 is at ground. This state is illustrated at 202 in FIG. 2. Reference numeral 204 in FIG. 2 illustrates the state when M2 and M3 are on and M1 and M4 are off. With M3 on and M4 off, OUT2 will be at HV and OUT1 will be at ground.

Vertical dashed lines 210 in FIG. 2 designate when the transistors M1-M4 are caused to be transitioned between their on and off states by control signals CTL1-CTL4. The transistors M1-M4 do not change state instantaneously and instead transition between on and off states in accordance with a slew rate as illustrated by the slopes of the transition voltages 215. A slew rate for a transistor is a function of, among other things, the transistor's gate-to-source voltage and the drain current through the transistor. The drain currents for transistors M1-M4 are generated by the current sources I1 and I2. As long as I1 equals I2 and the voltages of CTL1-CTL4 track each other in terms of their high voltages and low voltages and their transition times, the slew rates for OUT1 and OUT2 will be identical (albeit of course in opposite directions as shown). FIG. 2 illustrates that the cross-over points 220 in the OUT1 and OUT2 waveforms occur at the average of OUT1 and OUT2 (i.e., the voltage that is ½*(OUT1+OUT2). This means that the common mode voltage of OUT1 and OUT2 is constant. Alternatively stated, in the waveform of FIG. 2, the sum of OUT1 and OUT2 is a voltage (HV) that does not vary over time.

If, however, the current sources I1 and I2 are not matched or drift apart, then the rate at which some of the transistors M1-M4 turn on and off will be different than the rate at which other of the transistors turn on and off. For example, if I1 is larger than I2, then M1 will turn on harder than M4, and M3 will turn on harder than M2. FIG. 3 illustrates a similar set of OUT1 and OUT2 waveforms as FIG. 2 but with the slew rates of OUT1 being different than OUT2. In this example, OUT1 transitions from high to low and from low to high at a faster rate than OUT2. As a result, the sum of OUT1 and OUT2 does not remain constant as is evidenced by the fact the cross-over points 320 are not coincident with the ½(OUT1+OUT2) voltage level.

The control circuit 150 in the example of FIG. 1 ensures that OUT1 and OUT2 are controlled so as to have a constant common mode level. The control circuit 150 includes transistors M5, M6, M7, M8, M9 and M10, resistors R1, R2, and R3, and buffer 155. In this example, M5, M6, and M9 are PMOS devices and M7, M8, and M10 are NMOS devices, but can be implemented as other types of transistors in other implementations. Resistors R1-R3 are connected to the supply voltage node 105. The opposing terminal of R1 is connected to the source of M5, and the drain of M5 is connected to the drains of both M7 and M6. The source of M7 is connected to ground. The gate of M7 is connected to its drain and to the gate of M8. M7 and M8 are configured to operate as a current mirror 160, such that current that flows through M7 is mirrored through M8. M10 is biased on by way of gate voltage VB and provides protection from the higher voltage level of HV.

The current that flows through M5 is designated as I5 and the current that flows through M6 is designated as I6. I5 is a function of the gate-to-source voltage on M5, which itself is a function of OUT1. Similarly, I6 is a function of OUT2. As the drains of M5 and M6 are connected together at node 162, the current I7 through M7 is the sum of I5 and I6 (i.e., I7=I5+I6). I7 is thus a current representation of the sum of OUT1 and OUT2. In this example, the size of M5 and M6 is the same. That is, the channel length and width of M5 equals the channel length and width of M6.

The control circuit 150 controls either or both of the current sources I1 and I2 to ensure that OUT1+OUT2 remains constant. Within the control circuit 150, this means that I7 (which is a current that corresponds to OUT1+OUT2) should remain equal to I9. The control circuit 150 responds to differences between I7 and I9 to adjust one or both of the current sources I1 or I2 to regulate I7 to remain equal to I9. I9 is a static current that is set based, at least in part, on the gate-to-source voltage of M9. In general, the drain current of a MOSFET device is a function of, among other parameters, the channel width, the channel length, and the gate-to-source voltage. In one example, the width (W) of M5 and M6 are the same and the lengths (L) of M5 and M6 are the same (i.e., M5 and M6 are the same size). Further, the length of M9 is the same as that of M5 and M6, but the width of M9 is twice the width of M5 and M6. Then in order for I9 to be equal to I7, the gate voltage on M9 would need to be HV/2, and in some implementations that is the case. If the gate voltage on M9 was HV/2 and if the ratio of W/L of M9 is twice that of M5 or M6, then I9 would be a current that corresponds to HV, and I7 would be a current that is equal to I9 when OUT1+OUT2 equals HV.

In the example of FIG. 1, the voltage applied to the gate of M9 is HV/2 (i.e., one-half of the HV supply voltage on the power supply node 105). In this example, the channel length of M9 is the same as the length of M5 and M6, but the width of M9 is twice the width of M5 and M6. To compensate for the gate voltage being one-half of HV, the width of M9 is twice the width of M5 or M6. With the width of M9 being twice the width of M5 or M6, then I9 will be equal to I7 as long as HV/2 is provided to the gate of M9. A voltage regulator can be used to generate both HV and HV/2.

The control circuit 150 creates two currents I7 and I9. I7 is a current that is a function of OUT1+OUT2. I9 is a function of HV. The sum of OUT1 and OUT2 should be equal to HV. Thus I7 should be equal to I9. The control circuit 150 implements a control loop to control one or both of the current sources I1 and I2 to ensure that I7 remains equal to I9 at all times. The buffer 155 has an input and output. The input to the buffer 155 is coupled to node 170 (the drain of M8), and the output of buffer 155 is shown coupled to control the current generated by I2. Alternatively, the output of buffer 155 can be used to control current source I1. The voltage on node 170 will remain at a certain level as long as OUT1+OUT2 remains equal to HV. If the sum of OUT1 and OUT2 deviates from that voltage level, then the output of the buffer 155 also changes, which in turn causes one or both of the current sources to change to thereby force a change in OUT1+OUT2 which then brings the voltage on node 170 back to its nominal value.

In some implementations, I1 is an NMOS device and I2 is a PMOS device, although other types of transistors can be used as well. In the example shown in FIG. 1, the output from buffer 155 is coupled to I2 and used to control the magnitude of the current from I2 to match the current of I1. The gate of I2 is biased using the output from buffer 155, or a voltage derived therefrom, while the gate of I2 is biased using a suitable reference voltage. In other implementations, buffer 155 is coupled to I1 and is used to control I1 to match I2. In yet other implementations, a pair of buffers (buffer 155 and another buffer coupled to node 170) is used to control each current source I1 and I2 to result in the currents form the current sources matching.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   an H-bridge circuit including transistors, a first output and a second output, a first current source having a first terminal directly coupled to a supply voltage terminal and a second terminal directly coupled to a current terminal of at least two of the transistors, and a second current source having a first terminal directly coupled to a ground terminal, and a second terminal coupled to a current terminal of at least two of the transistors; and
a control circuit including:
  a first transistor having a control input coupled to the first output, a first current terminal coupled to the supply voltage terminal, and a second current terminal;
  a second transistor having a control input coupled to the second output, a third current terminal coupled to the supply voltage terminal, and a fourth current terminal coupled to the second current terminal;
  a third transistor having a control terminal coupled to a reference voltage terminal supplying a reference voltage that is divided from the voltage at the supply voltage terminal, a fifth current terminal coupled to the supply voltage terminal, and a sixth current terminal; and
  a current mirror having a first input coupled to the second current terminal and a second input coupled to the sixth current terminal, the current mirror configured to mirror a current that is a sum of the currents through the first and second transistors;
  the control circuit being configured to drive the first output and second output to have matching currents by controlling the current of at least one of the first and second current sources through at least two of the transistors.

2. The circuit of claim 1, including a buffer coupled to the current mirror and the third transistor, the buffer configured to produce an output signal to control at least one of the first and second current sources.

3. The circuit of claim 1, wherein the first and third current terminals are coupled to the supply voltage terminal through resistors.

4. The circuit of claim 1, wherein the sixth current terminal is coupled to the second input of the current mirror through a fourth transistor.

5. The circuit of claim 1, wherein a width of the third transistor is twice a width of the first and second transistors.

6. The circuit of claim 1, wherein the control circuit is configured to control, based on the sum of voltages on the first and second outputs, current of both of the first and second current sources.

7. The circuit of claim 1, wherein the control circuit is configured to control at least one of the first and second current sources to cause a magnitude of current through the first current source to be substantially equal to a magnitude of current through the second current source.

8. The circuit of claim 7, wherein:
  the H-bridge circuit includes a fifth transistor, a sixth transistor, a seventh transistor, and an eighth transistor;
  the first current source is coupled to the fifth and seventh transistors and is configured to provide current to the fifth and seventh transistors;
  the second current source is coupled to the sixth and eighth transistors and is configured to receive current from the sixth and eighth transistors;
  the fifth and sixth transistors are coupled together at the first output; and
  the seventh and eighth transistors are coupled together at the second output.

9. A circuit, comprising
  a first transistor including a first control input, a first current terminal and a second current terminal;
  a second transistor including a second control input, a third current terminal and a fourth current terminal, the third current terminal connected to the second current terminal;
  a third transistor including a third control input, a fifth current terminal and a sixth current terminal, the fifth current terminal connected to the first current terminal;
  a fourth transistor including a fourth control input, a seventh current terminal and an eighth current terminal, the seventh current terminal connected to the sixth current terminal;
  a first current source having a first terminal connected to the first and fifth current terminals, and a second terminal directly coupled to a supply voltage terminal;
  a second current source having a first terminal connected to the fourth and eighth current terminals and a second terminal directly coupled to a ground terminal;
  a fifth transistor including a fifth control input coupled to the second and third current terminals, a ninth current terminal coupled to the supply voltage terminal through a resistor, and a tenth current terminal;
  a sixth transistor including a sixth control input coupled to the sixth and seventh current terminals, an eleventh current terminal coupled to the supply voltage terminal through a resistor, and a twelfth current terminal directly coupled to the tenth terminal;
  a seventh transistor including a seventh control input, a thirteenth current terminal and a fourteenth current terminal, the thirteenth current terminal connected to the tenth and twelfth current terminals as well as to the seventh control input;
  an eighth transistor including an eighth control input coupled to the seventh control terminal, a fifteenth current terminal and a sixteenth current terminal;
  a ninth transistor including a ninth control input, a seventeenth current terminal and an eighteenth current terminal, the ninth control input coupled to a reference voltage terminal supplying a reference voltage that is one-half of a voltage at the supply voltage terminal; and
  a tenth transistor including a tenth control input, a nineteenth current terminal connected to the eighteenth current terminal, and a twentieth current terminal connected to the fifteenth current terminal.

10. The circuit of claim 9, wherein a width of the ninth transistor is proportional to widths of the fifth and sixth transistors.

11. The circuit of claim 9, further including a buffer having an input and an output, the input of the buffer coupled to the fifteenth current terminal and the output of the buffer coupled to at least one of the first and second current sources.

12. The circuit of claim 9, including a buffer having an input coupled to the fifteenth current terminal, and an output coupled to the first current source and the second current source.

13. The circuit of claim 11, wherein a voltage on the fifteenth current terminal is used to control at least one of the first and second current sources to cause a magnitude of current through the first and second current sources to be substantially equal.

14. A circuit, comprising
  an H-bridge circuit including transistors, a first output and a second output, a first current source directly coupled to a supply voltage terminal and a second terminal directly coupled to a current terminal of at least two of the transistors, and a second current source having a first terminal directly coupled to a ground terminal and a second terminal coupled to a current terminal of at least two of the transistors; and a first transistor having a first control input coupled to the first output, a first current terminal coupled to the supply voltage terminal and a second current terminal;

a second transistor having a second control input coupled to the second output, a third current terminal coupled to the supply voltage terminal, and a fourth current terminal coupled to the second current terminal;

a third transistor having a third control input, a fifth current terminal coupled to the second and fourth current terminals and the third control input, and a sixth current terminal connected to the ground terminal;

a fourth transistor having a fourth control input coupled to the third control input, a seventh current terminal, and an eighth current terminal connected to the ground terminal;

a fifth transistor having a fifth control input, a ninth current terminal coupled to the supply voltage terminal, and a tenth current terminal, the fifth control input coupled to a reference voltage terminal supplying a reference voltage that is one-half of a voltage at the supply voltage terminal; and a sixth transistor having a sixth control input, an eleventh current terminal connected to the tenth current terminal, and a twelfth current terminal connected to the seventh current terminal.

15. The circuit of claim 14, further including a buffer having an input and an output, the input of the buffer coupled to the seventh and twelfth current terminals, and the output of the buffer coupled to at least one of the first and second current sources.

16. The circuit of claim 14, wherein a length of the first transistor equals a length of the second transistor and a width of the first transistor equals a width of the second transistor.

17. The circuit of claim 16, wherein a length of the fifth transistor is equal to the length of the first and second transistors, and a width of the fifth is twice the width of the first and second transistors.

18. The circuit of claim 14, wherein the voltage that is one-half of the voltage at the supply voltage terminal is at least 25 volts.

19. The circuit of claim 14, wherein the ninth current terminal couples to the supply voltage terminal through a transistor.

* * * * *